(12) United States Patent
Veliadis et al.

(10) Patent No.: US 7,667,242 B1
(45) Date of Patent: Feb. 23, 2010

(54) SYSTEMS AND METHODS FOR MAXIMIZING BREAKDOWN VOLTAGE IN SEMICONDUCTOR DEVICES

(75) Inventors: John V. Veliadis, Hanover, MD (US); Eric Jonathan Stewart, Silver Spring, MD (US); Megan Jean McCoy, Columbia, MD (US); Li-Shu Chen, Ellicott City, MD (US); Ty Richard McNutt, Columbia, MD (US)

(73) Assignee: Northrop Grumman Systems Corporation, Baltimore, MD (US)

( * ) Notice: Subject to any disclaimer, the term of this patent is extended or adjusted under 35 U.S.C. 154(b) by 510 days.

(21) Appl. No.: 11/601,064

(22) Filed: Nov. 17, 2006

Related U.S. Application Data

(63) Continuation-in-part of application No. 11/584,990, filed on Oct. 23, 2006, now Pat. No. 7,557,046.

(51) Int. Cl.
*H01L 29/74* (2006.01)
(52) U.S. Cl. .......... 257/127; 257/605; 257/409; 257/452; 257/484; 438/624
(58) Field of Classification Search ............... 257/127, 257/129, 170, 409, 605, 484, 452
See application file for complete search history.

(56) References Cited

U.S. PATENT DOCUMENTS

| | | | |
|---|---|---|---|
| 4,974,055 A | 11/1990 | Haskell | |
| 5,324,673 A | 6/1994 | Fitch et al. | |
| 5,736,457 A | 4/1998 | Zhao | |
| 6,294,460 B1 | 9/2001 | Subramanian et al. | |
| 6,756,319 B2 | 6/2004 | Kim et al. | |
| 6,998,204 B2 | 2/2006 | Furukawa et al. | |

*Primary Examiner*—Thao Le
(74) *Attorney, Agent, or Firm*—Fulbright & Jaworski L.L.P.

(57) ABSTRACT

Systems and methods for maximizing the breakdown voltage of a semiconductor device are described. In a multiple floating guard ring design, the spacing between two consecutive sets of floating guard rings may increase with their distance from the main junction while maintaining depletion region overlap, thereby alleviating crowding and optimally spreading the electric field leading to a breakdown voltage that is close to the intrinsic material limit. In another exemplary embodiment, fabrication of floating guard rings simultaneously with the formation of another semiconductor feature allows precise positioning of the first floating guard ring with respect to the edge of a main junction, as well as precise control of floating guard ring widths and spacings. In yet another exemplary embodiment, design of the vertical separation between doped regions of a semiconductor device adjusts the device's gate-to-source breakdown voltage without affecting the device's pinch-off voltage.

8 Claims, 14 Drawing Sheets

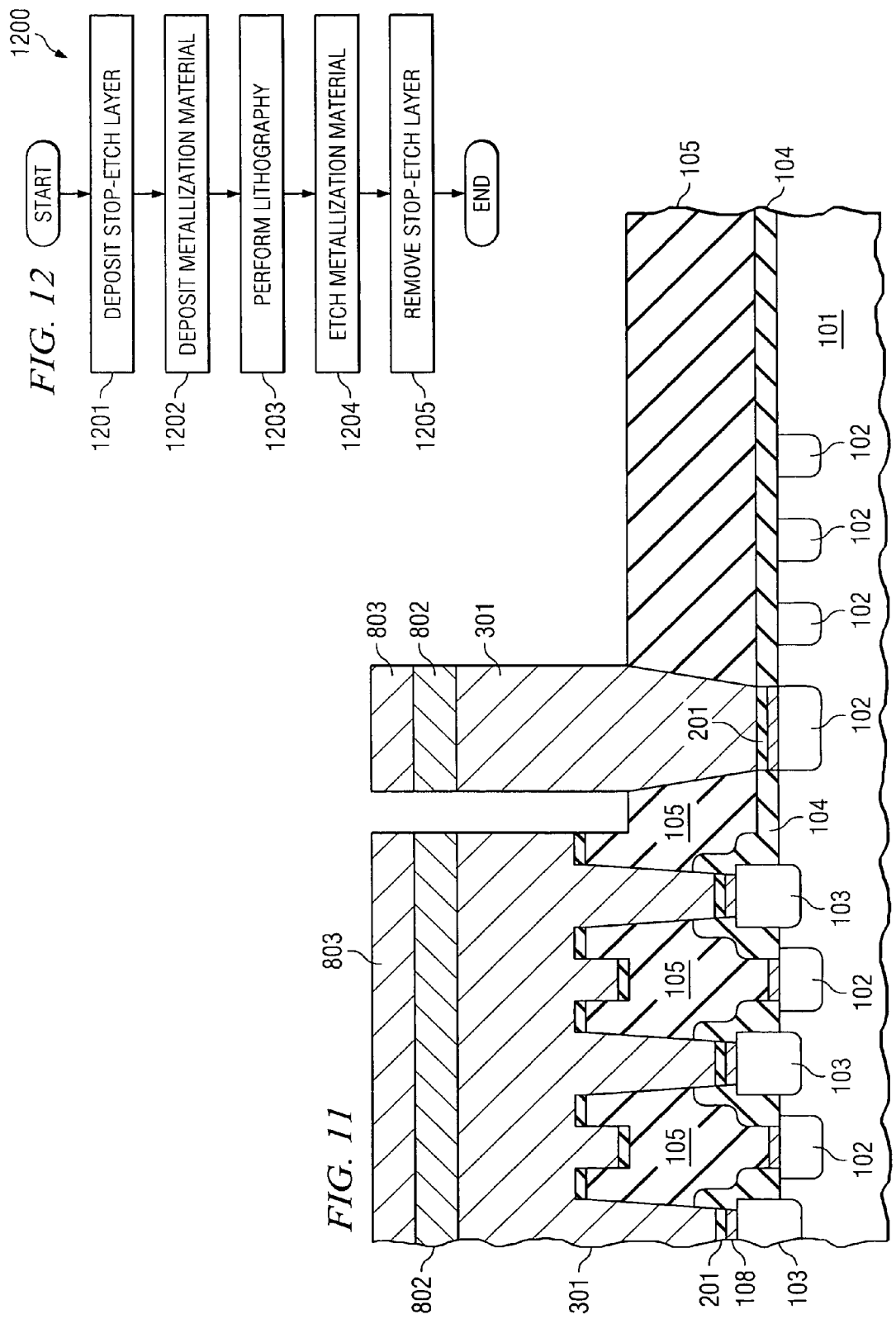

SYSTEMS AND METHODS FOR MAXIMIZING BREAKDOWN VOLTAGE IN SEMICONDUCTOR DEVICES

TECHNICAL FIELD

The present invention relates generally to semiconductor technology and, more particularly, to systems and methods maximizing breakdown voltage in semiconductor devices.

BACKGROUND OF THE INVENTION

Breakdown voltage requirements for semiconductor devices may range from a few volts to over 10,000 volts, depending upon the particular application. Typically, this voltage is supported by depletion layers formed across p-n junctions, metal semiconductor interfaces (e.g., Schottky diodes), and metal-oxide semiconductor (MOS) interfaces.

The inventors hereof have recognized that it would be desirable to minimize device resistance while maintaining breakdown voltage capability that is as close as possible to the intrinsic capability of the underlying semiconductor material. In practice, however, premature voltage breakdown due to the occurrence of high electric fields at the edges of the device can limit resistance vs. breakdown voltage performance. Some of the edge termination techniques previously used to alleviate the electric field crowding at the edges of the device include moat etch, surface implantation, single floating guard rings, bevel edge, and field plate terminations.

BRIEF SUMMARY OF THE INVENTION

Embodiments of the present invention comprise systems and methods for maximizing the breakdown voltage of a semiconductor device by optimizing the width, spacing, and/or number of multiple floating guard rings. In one exemplary embodiment, the spacings between two consecutive sets of floating guard rings may increase with their distance from the main junction while maintaining depletion region overlap, thus alleviating electric field crowding, optimally spreading the electric field, and yielding a breakdown voltage that is close to the material's limit.

In another exemplary embodiment, the present invention comprises systems and methods for fabricating floating guard rings simultaneously with the formation of other semiconductor features such as, for example, source pillars, thereby minimizing the number of required processing steps and implantations. Accordingly, this embodiment allows precise positioning of a first and subsequent floating guard rings with respect to the edge of a main junction, as well as precise control of floating guard ring widths and spacings. In addition, this embodiment makes the floating guard ring structure insensitive to wafer flatness, thickness variations, and the occurrence of broken rings, which are detrimental to breakdown performance. In yet another exemplary embodiment, the present invention comprises systems and methods for designing the vertical separation between doped regions of a semiconductor device so as to allow the device to be biased for maximum breakdown voltage.

The present invention provides numerous advantages and benefits over the prior art. For instance, it provides semiconductor devices with breakdown voltages that are as close as possible to the intrinsic capability of their underlying semiconductor materials, thereby minimizing overall device resistance at a given breakdown voltage. The optimization of breakdown voltage expands the range of applications for which semiconductor devices may be used, improves their efficiency, increases switching frequency, and reduces failures. In addition, the semiconductor fabrication methods disclosed herein eliminate several processing steps and implantations, thus resulting in faster wafer throughput, higher yields, and lower costs. Many other advantages and benefits of the invention will be readily recognized by a person of ordinary skill in the art in light of this disclosure.

The foregoing has outlined rather broadly certain features and technical advantages of the present invention so that the detailed description that follows may be better understood. Additional features and advantages are described hereinafter. As a person of ordinary skill in the art will readily recognize in light of this disclosure, specific embodiments disclosed herein may be utilized as a basis for modifying or designing other structures for carrying out the same purposes of the present invention. Such equivalent constructions do not depart from the spirit and scope of the invention as set forth in the appended claims. Several inventive features described herein will be better understood from the following description when considered in connection with the accompanying figures. It is to be expressly understood, however, the figures are provided for the purpose of illustration and description only, and are not intended to limit the present invention.

BRIEF DESCRIPTION OF THE DRAWINGS

For a more complete understanding of the present invention, reference is now made to the following drawings, in which:

FIGS. 8-11 are cross-sectional views illustrating processing steps for a semiconductor device where a metal mask or pattern is formed;

FIG. 12 is flowchart illustrating an interconnect metallization method using a stop-etch layer;

DETAILED DESCRIPTION OF THE INVENTION

In the following description, reference is made to the accompanying drawings that form a part hereof, and in which exemplary embodiments of the invention may be practiced by way of illustration. These embodiments are described in sufficient detail to enable a person of ordinary skill in the art to practice the invention, and it is to be understood that other embodiments may be utilized, and that changes may be made, without departing from the spirit of the present invention. The following description is, therefore, not to be taken in a limited sense, and the scope of the present invention is defined only by the appended claims.

Single lithographic step interconnect metallization systems and methods are disclosed herein representing some exemplary embodiments of the present invention. Although certain embodiments discussed below utilize an Ion-implanted Static-Induction-Transistor (SIT) for illustration purposes, a person of ordinary skill in the art will readily recognize that the present invention is not limited to the fabrication of this particular device and may, in fact, be used in the fabrication of any semiconductor diode and/or any vertical semiconductor device that blocks voltage such as, for instance, metal-oxide-semiconductor field-effect transistors (FETs), thrysistors, p-n diodes, p-i-n diodes, isolated-gate bipolar transistors, bipolar-junction transistors, bipolar SITs, biFETs, and SiTH, among others. Moreover, while examples illustrated below may indicate specific materials and dimensions, a person of ordinary skill in the art will also recognize that certain variations and modifications may be made without departing from the spirit and scope of the present invention.

Figure 1:
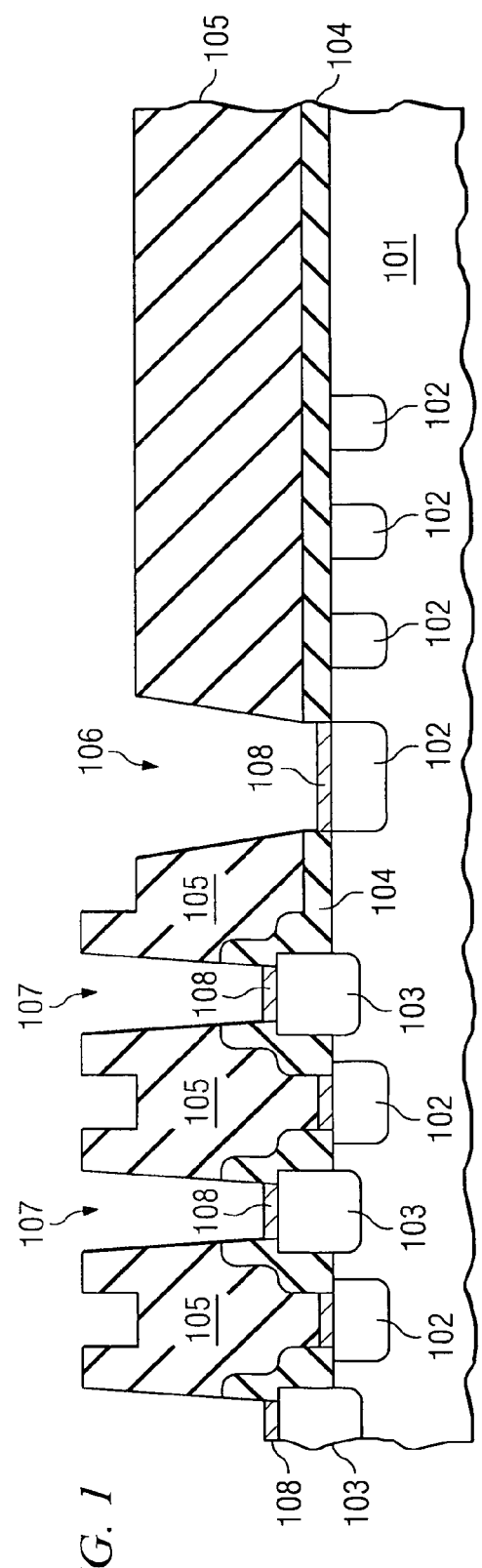
FIG. 1 is a cross-sectional view illustrating a semiconductor device prepared for interconnect metallization.

FIG. 1 shows a semiconductor device prepared for metallization, according to an exemplary embodiment of the present invention. Substrate and epitaxy 101 has several p+ and n+ doped regions 102 and 103, respectively. First dielectric layer 104 is located over substrate or epitaxy 101, and one or more dielectric layers 105 are located over first dielectric layer 104. Any number of dielectric layers (including zero) 105 may be present. In one exemplary embodiment, substrate and epitaxy 101 may be silicon carbide (SiC) or gallium nitride (GaN). Additional dielectric layers 105 may be, for instance, phosphosilicate glass or PSG (i.e., silica ($SiO_2$)), silicon nitride (i.e. $Si_3N_4$), thermally grown oxide, and tetraethyl orthosilicate deposited $SiO_2$ (i.e. TEOS deposited $SiO_2$), whereas first dielectric layer 104 may be, for instance, borophosphosilicate glass or BPSG. In this example, source and gate metallization layers 108 are also shown. Areas 106 and 107 over the gate-bus region and n+ source fingers of the SIT, respectively, are open to receive interconnect metallization.

Figure 2:
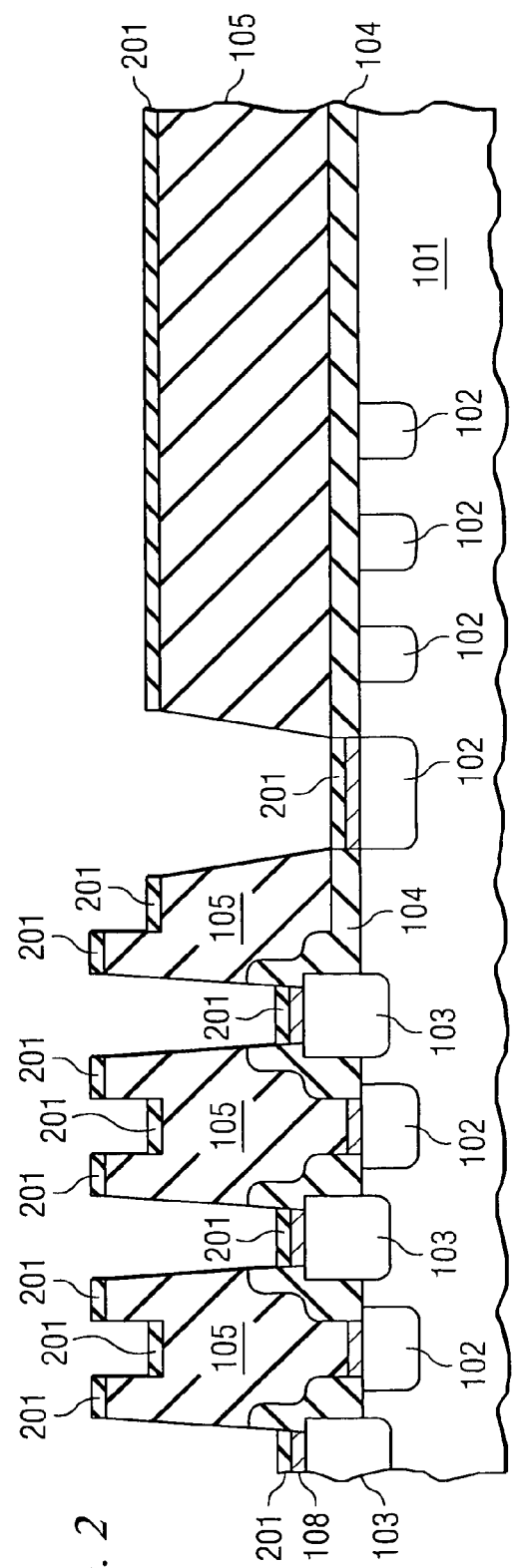
FIG. 2 is a cross-sectional view illustrating a semiconductor device with a stop-etch layer deposited over the device.

FIG. 2 shows the semiconductor device of FIG. 1 with stop-etch layer 201, according to an exemplary embodiment of the present invention. In one exemplary embodiment, a layer of chrome (Cr) is deposited by physical-vapor-deposition (e.g., evaporation, e-beam evaporation, sputtering), or by chemical-vapor-deposition over the wafer, thereby creating stop-etch layer 201. Preferably, stop-etch layer 201 has a CTE matched to that of the underlying semiconductor material. Layer 201 may, for example, have a thickness of about 200 Å. Further, layer 201 may be capable of stopping sulfur hexafluoride (SF6) from etching portions of the device that are covered by it during a subsequent reactive-ion-etching (RIE) step. Layer 201 may also be designed to protect covered regions from other etching processes and/or agents.

Figure 3:
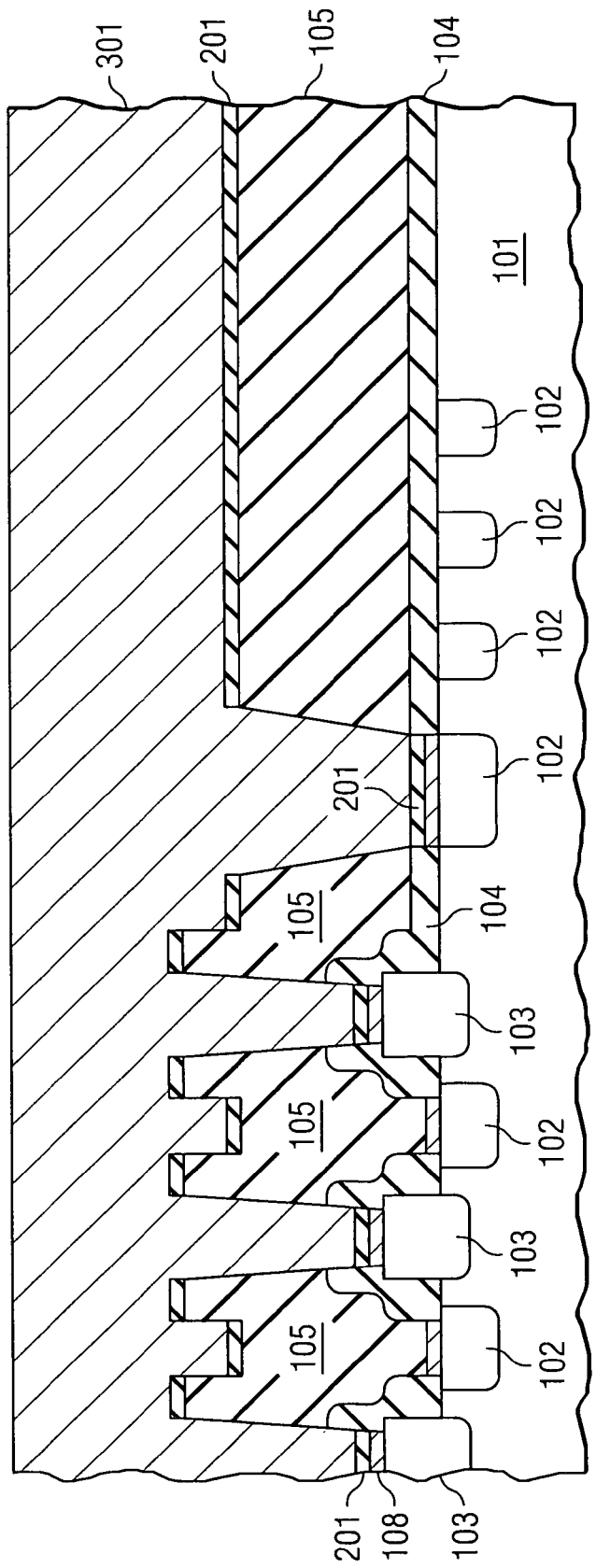
FIG. 3 is a cross-sectional view illustrating a semiconductor device with a layer of interconnect metallization material deposited over the stop-etch layer.

FIG. 3 shows the semiconductor device of FIG. 2 with a layer of interconnect metallization material 301 deposited over stop-etch layer 201, according to an exemplary embodiment of the present invention. For example, metallization material 301 may comprise titanium (Ti), tungsten (W), titanium nitride (TiN), titanium tungsten (TiW), molybdenum (Mo), or any combination thereof. In one exemplary embodiment, metallization material 301 is a mixture of titanium, nitrogen, and tungsten. Preferably, layer 301 has a CTE matched to that of the underlying semiconductor material. The thickness of metallization material layer 301 may vary according to the type of metallization material and/or deposition method used. For instance, when tungsten is chosen as metallization material, chemical-vapor deposition (CVD) may be used to create a W (17000 Å) layer. In another example, physical-vapor-deposition (PVD or "sputtering") may be used to create a Ti (200 Å) layer or a TiW (1000 Å) layer.

In one exemplary embodiment of the present invention, a lithography and a dielectric etch operation may pattern dielectric material over certain areas of the CTE matched interconnect metal layers, thereby forming a dielectric mask or pattern. In another embodiment, a lithography operation may place resist material over certain areas of the CTE matched interconnect metal layers, thereby forming a resist mask or pattern. There exemplary embodiments are described below with respect to FIGS. 4-7, where layer 401 may be a dielectric or a resist material. In yet another exemplary embodiment, interconnect metal layers may be deposited in addition to resist material, where the top metal layer of the metallization stack may be selected to stop etch chemicals. This exemplary embodiment is described below with respect to FIGS. 8-11.

Figure 4:
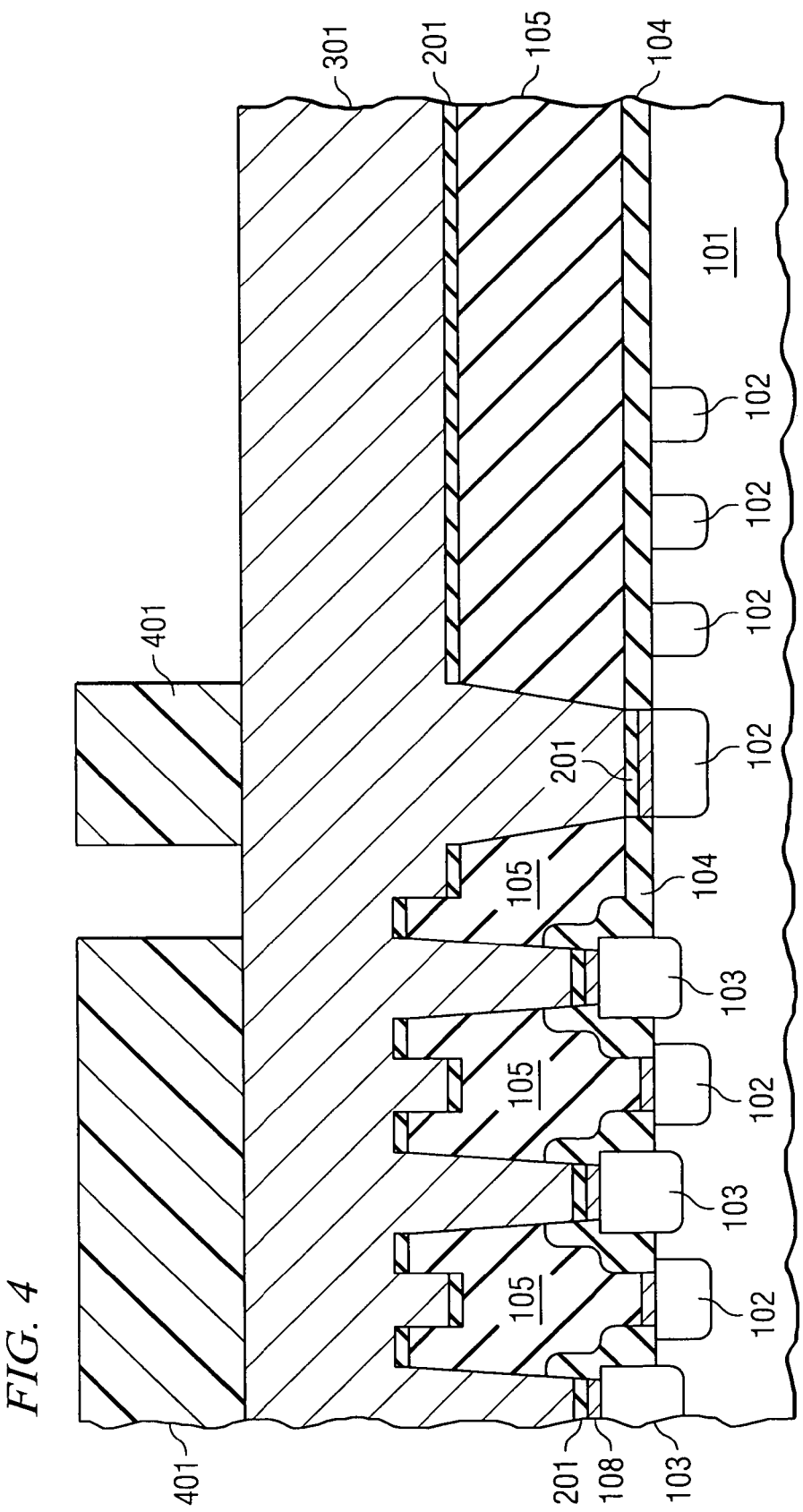
FIGS. 4-7 are cross-sectional views illustrating processing steps for a semiconductor device where a resist mask or pattern, or a dielectric mark or pattern are formed.
Figure 5:
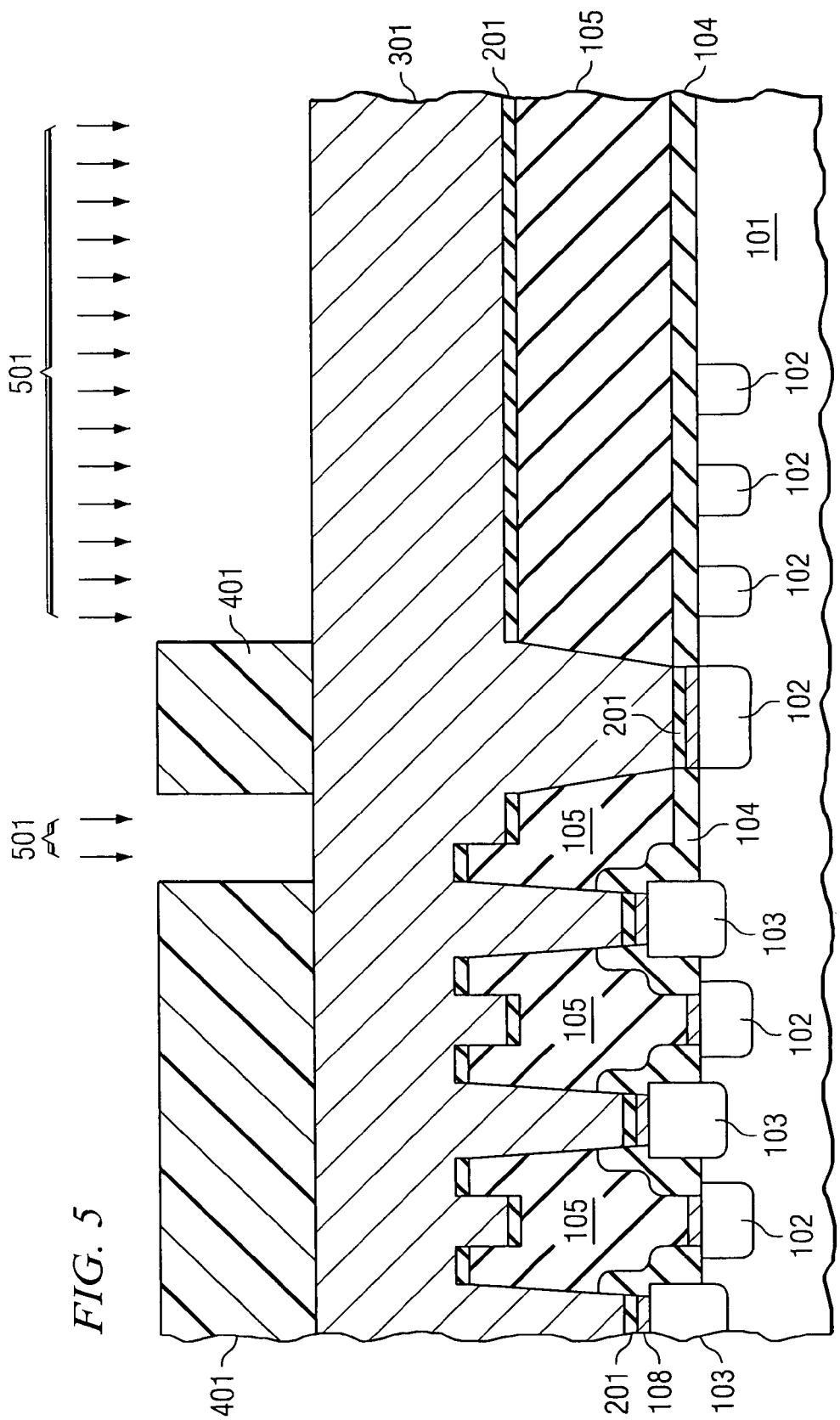
Figure 6:
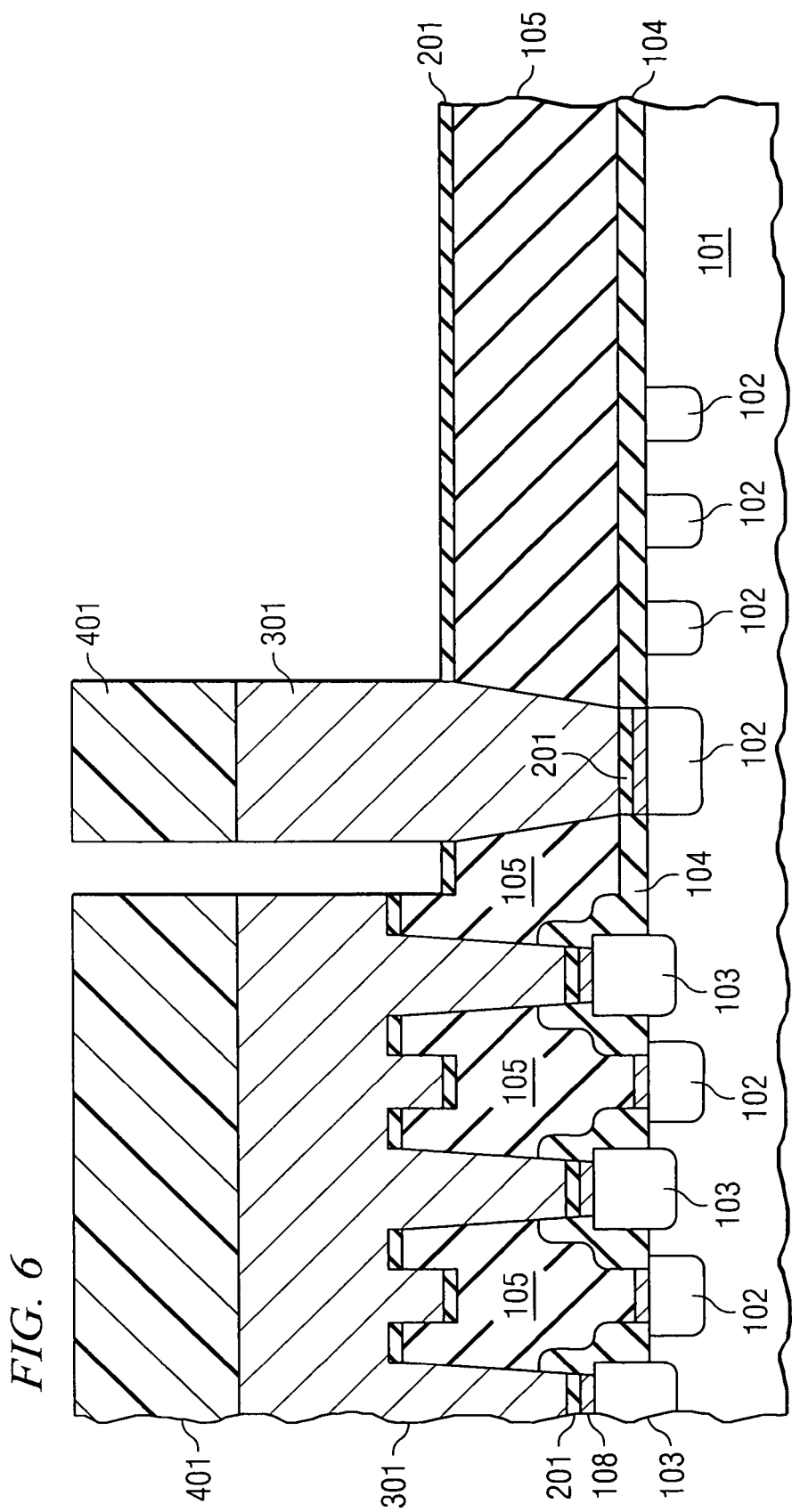
Figure 7:
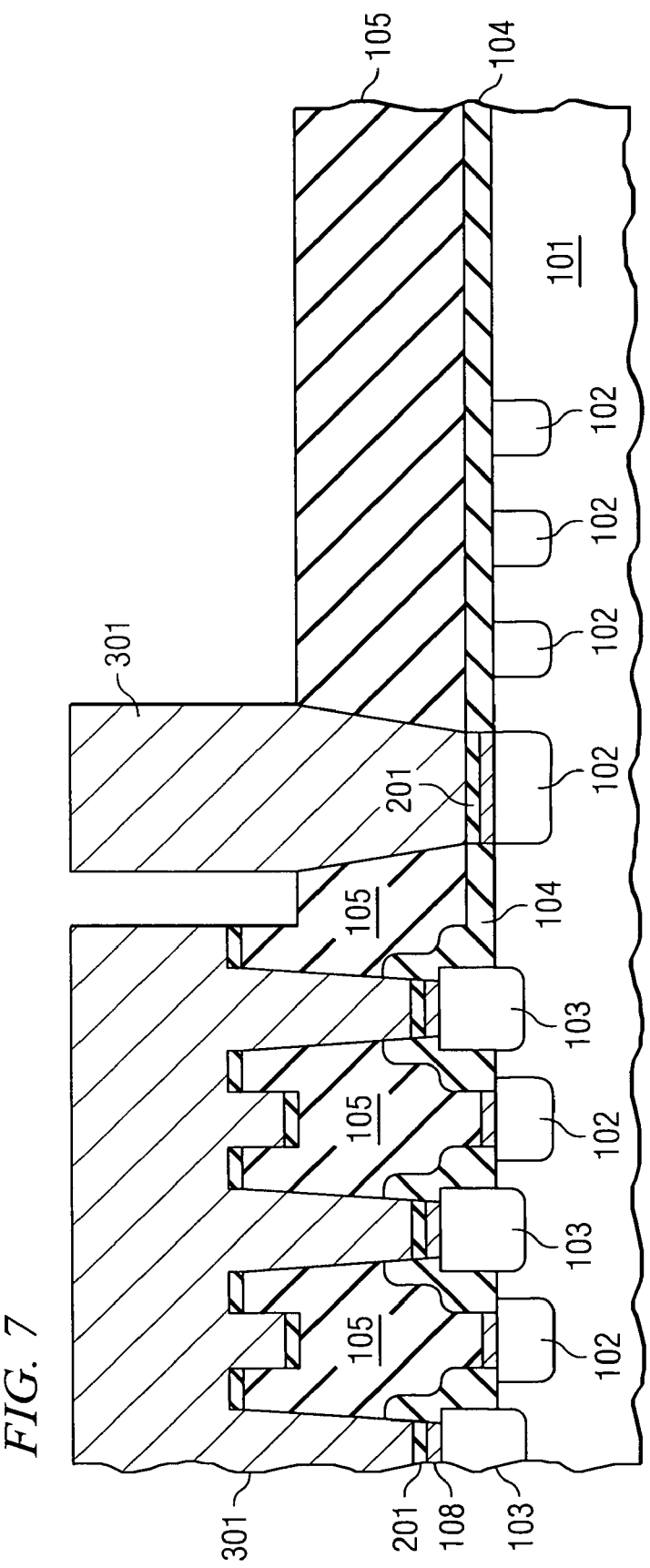

Turning now to FIGS. 4-7, cross-sectional views illustrating processing steps for a semiconductor device where a resist mask or a dielectric mask is formed are provided according to exemplary embodiments of the present invention. FIG. 4 shows the semiconductor device of FIG. 3 with patterned resist or dielectric layer 401, which may block action by etching agents. FIG. 5 shows the semiconductor device of FIG. 4 under etching process 501 that may be, for example, a reactive-ion-etching (RIE) process, a wet chemical etching process, or a dry chemical etching process. FIG. 6 shows the semiconductor device of FIG. 5 after interconnect metallization material 301 has been uniformly etched in non-resist or non-dielectric covered areas. An etching agent such as, for example, sulfur hexafluoride (SF6), may be blocked by stop-etch layer 201, thus protecting dielectric layer 105 and underlying layers from being undesirably etched. FIG. 7 shows the semiconductor device of FIG. 6 where resist or dielectric layer 401 and stop-etch layer 201 have been removed, for instance, with a chemical dip or exposure of the wafer to a very high energy RF process.

Figure 8:
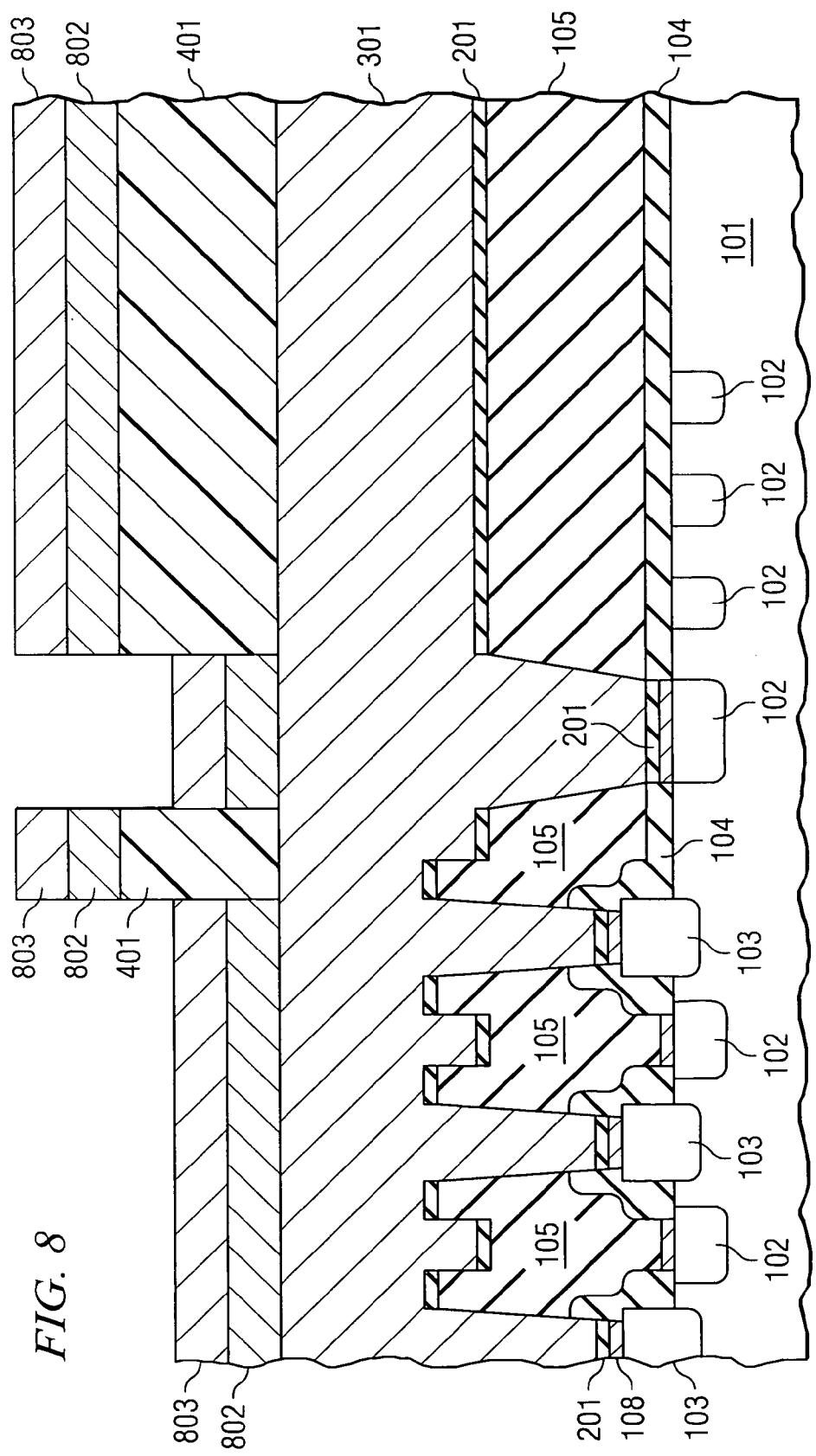
Figure 9:
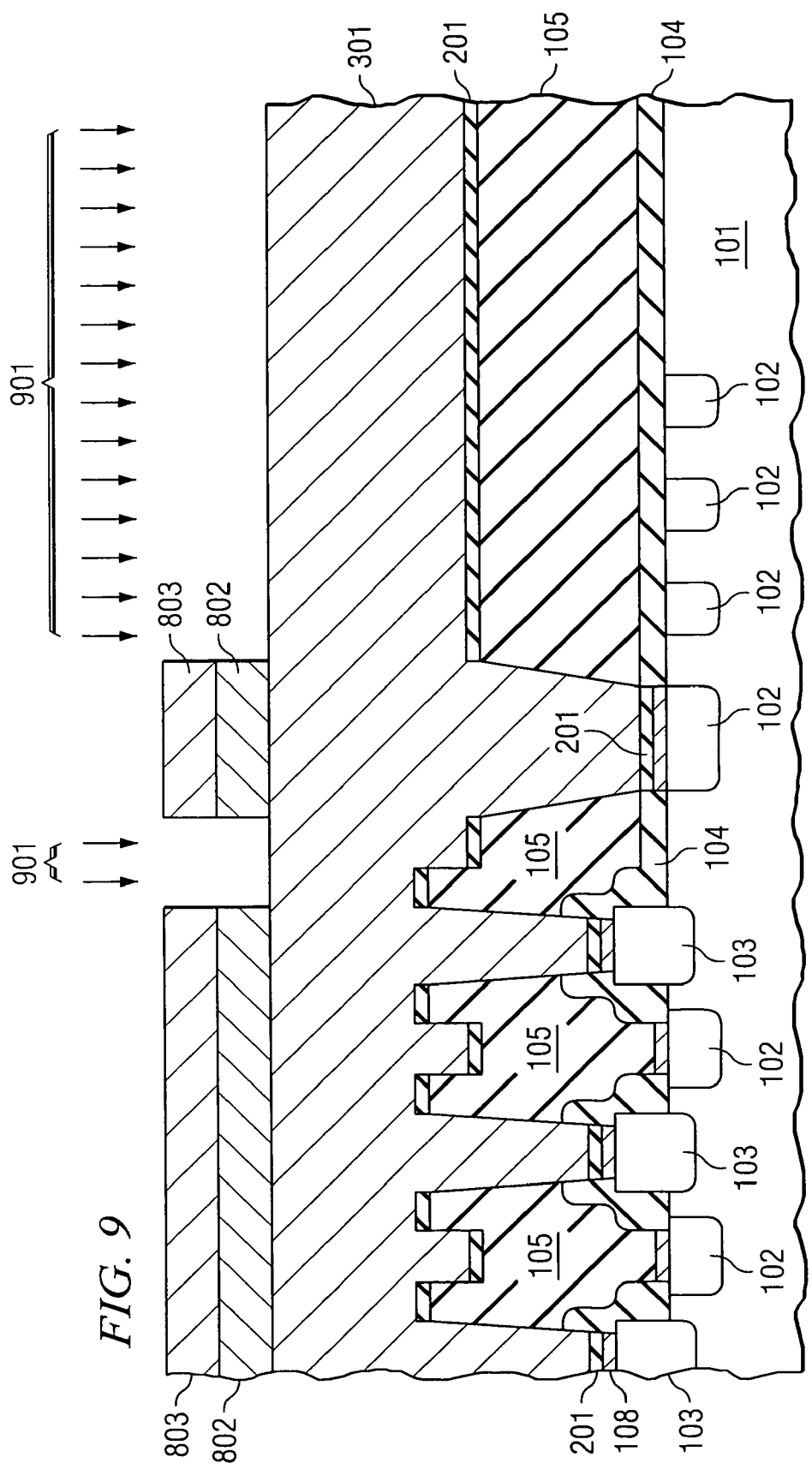
Figure 10:
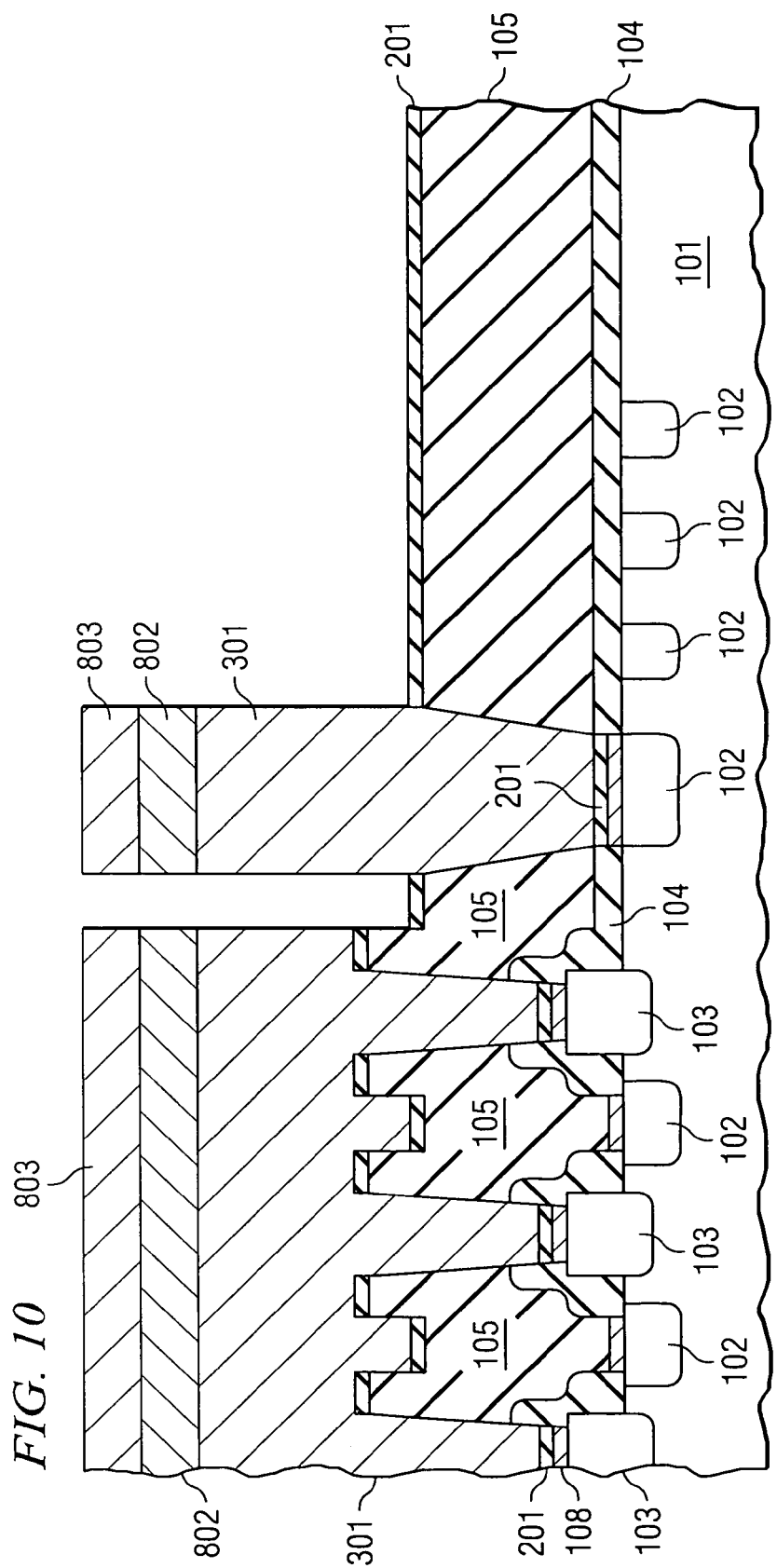

With respect to FIGS. 8-11, cross-sectional views illustrating processing steps for a semiconductor device where a metal mask is formed are provided according to exemplary embodiments of the present invention. FIG. 8 shows the semiconductor device of FIG. 3 with patterned resist 401 and layers of material 802 and 803, which may be deposited, for example, by physical vapor deposition (e.g., evaporation, e-beam evaporation, sputtering) or chemical vapor deposition. Resist 401 may be patterned onto the device in a lithographic step. Layers 802 (e.g., Ti/Pt) and 803 (e.g., Au) may be evaporated. In one exemplary embodiment, layer 803 is optional. In another embodiment, Ti/Pt layer 802 and/or Au layer 803 forms a metal mask which may block action by etching agents. FIG. 9 shows the semiconductor device of FIG. 8 after lift-off and under an etching process 901 that may be, for example, a reactive-ion-etching (RIE) process, a wet chemical etching process, or a dry chemical etching process. FIG. 10 shows the semiconductor device of FIG. 9 after interconnect metallization material 301 has been uniformly etched in non-metal-mask covered areas. Again, an etching agent may be blocked by stop-etch layer 201, thus protecting dielectric layer 105 and underlying layers from being undesirably etched. FIG. 11 shows the semiconductor device of FIG. 10 where stop-etch layer 201 has been removed, for instance, with a chemical dip or exposure of the wafer to an RF process.

As described above, FIGS. 7 and 11 show the semiconductor devices of FIGS. 4 and 8, respectively, with the resulting interconnect metallization. The present invention reduces the number of necessary processing steps in the fabrication process because it requires a single lithographic step and only one or zero corresponding metal lift-off steps depending on the desired composition of interconnect metal layers. Moreover, the present invention permits that the wafer be "over etched," either purposefully (e.g., to achieve uniformity) or as a result of inadvertent mistake, without damage to the underlying wafer, die, and/or device. The stop-etch layer is later removed, thus resulting in a uniformly etched wafer.

FIG. 12 shows a flowchart of a single lithography step interconnect metallization method using a stop-etch layer according to one embodiment of the present invention. In step 1201, a layer of stop-etch material (e.g., chrome (Cr)) is deposited over a wafer, thereby creating a stop-etch layer that is capable of stopping an etching process and/or etching agent from reaching the device. A layer of interconnect metallization material is deposited over the stop-etch layer in step 1202. In step 1203, a dielectric material is patterned over the interconnect metallization material. In another embodiment, a resist material is patterned over the interconnect metallization material in step 1203. In yet another embodiment, this lithography step is accompanied by the deposition of at least one metal layer (e.g., Ti/Pt, Au, Al, Cu, Ni, Cr, etc.) and a lift-off. In step 1204, an etching process is used to remove interconnect metallization material in non-covered areas of the wafer. Finally, in step 1205, the stop-etch layer is removed, thus resulting in the desired interconnect metallization.

Systems and methods for designing and fabricating semiconductor floating guard rings are also disclosed herein representing exemplary embodiments of the present invention. Although certain embodiments discussed below utilize implanted vertical-junction field-effect transistors (VJFETs) and/or ion-implanted-static-induction-transistor (SITs) for illustration purposes, a person of ordinary skill in the art will readily recognize that the present invention is not limited to the design and/or fabrication of this particular device, and may, in fact, be used in the design and/or fabrication of any semiconductor device (e.g., MOSFETs, BJTs, IGBTs, and rectifiers, among many others), including semiconductor diodes and any vertical semiconductor device that blocks voltage. Moreover, while examples illustrated below may indicate specific materials and dimensions, a person of ordinary skill in the art will also recognize that certain variations and modifications may be made without departing from the spirit and scope of the present invention.

Figure 13:
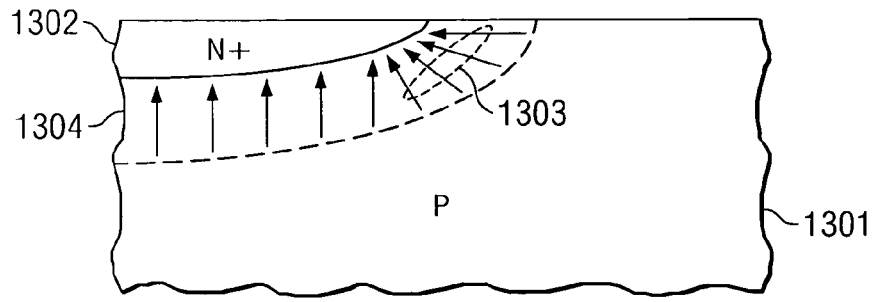
FIG. 13 is a cross-sectional view illustrating a p-n junction of semiconductor device.
Figure 14:
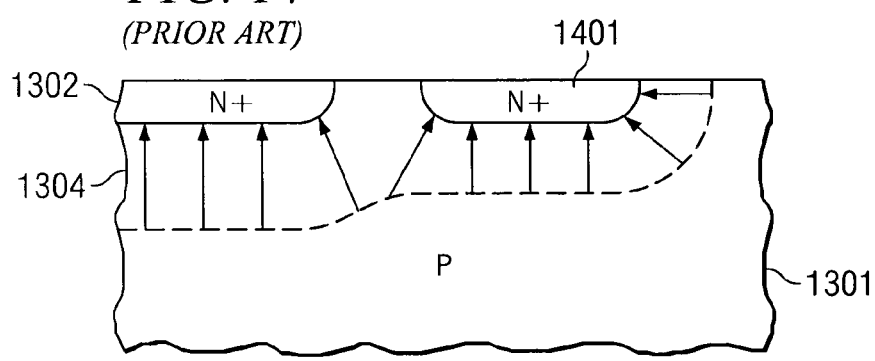
FIG. 14 is a cross-sectional view illustrating a semiconductor device with a single floating guard ring.

FIG. 13 shows a p-n junction of a semiconductor device as it is known in the art. Depletion region 1304 is formed between p and n+ regions 1301 and 1302, respectively. The breakdown voltage of this device (i.e., the maximum voltage that can be applied across depletion region 1304 before it collapses) is often reduced by the occurrence of high electric fields either within the interior portion of the device structure or at the edges of the device. In this illustration, edge region 1303 represents electrical field crowding that reduces the breakdown voltage of the device. A prior art solution to this problem involves the use of single floating guard ring 1401, as shown in FIG. 14. Single floating guard ring 1401 may be used to alleviate the electric field crowding at the edges of the device by effectively extending depletion region 1304. As a result, some of the electric field lines are terminated by floating guard ring 1401 and the electric field crowding at the edge of the main device is reduced, thus resulting in some improvement in device breakdown voltage. However, the use of single floating guard ring 1401 is unsatisfactory insofar as it does not bring the device's breakdown voltage close to its optimal or maximum possible value.

Figure 15:
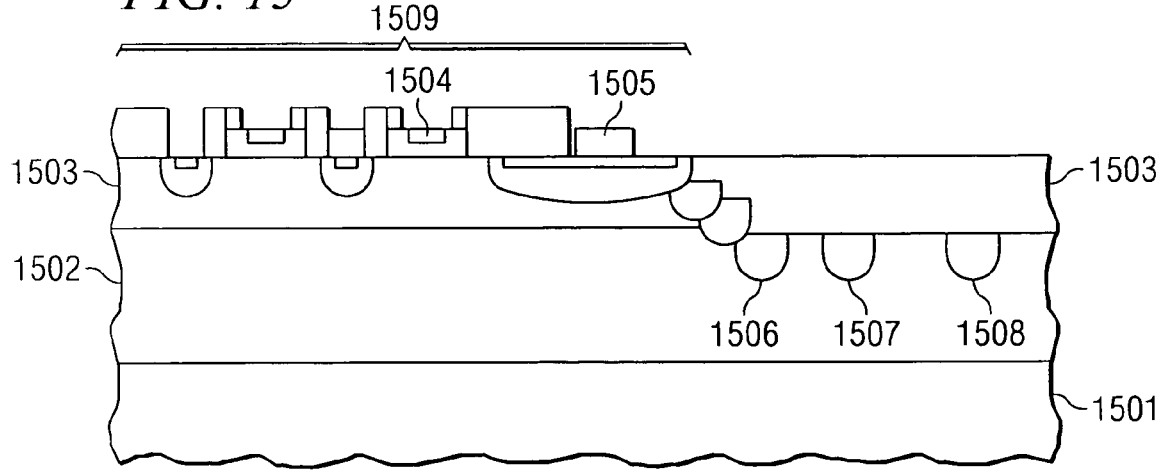
FIG. 15 is a cross-sectional view illustrating a semiconductor device with multiple floating guard rings.

FIG. 15 shows a semiconductor device with multiple floating guard rings according to one embodiment of the present invention. Second epitaxial layer 1503 is grown over first epitaxial layer 1502, which is grown over substrate 1501. Device 1509 has its many components (e.g., source 1504 and gate bus 1505) deposited or implanted over second epitaxial layer 1503. In one exemplary embodiment, substrate 1501 is a silicon carbide (SiC) substrate and device 1509 is a VJFET. Main junction 1506 represents a p-n junction at the surface of first epitaxial layer 1502, and guard rings 1507 and 1508 are the first and second of a plurality of floating guard rings deposited or implanted into first epitaxial layer 1502. As a person of ordinary skill in the art will recognize in light of this disclosure, the plurality of floating guard rings 1507 and 1508 need not be created inside the first epitaxial layer 1502, but may instead be created inside the second epitaxial surface 1503 using standard semiconductor processing techniques.

The thickness, composition, and doping levels of epitaxial semiconductor layers 1502 and 1503 set the maximum possible breakdown voltage for semiconductor device 1509, and the use of multiple floating guard rings increases the breakdown voltage of device 1509. In one embodiment, elements of the multiple floating guard ring design include (1) the proximity of first guard ring 1507 to main junction 1506, (2) the widths of the guard rings, (3) the number of guard rings, and (4) the spacings between the guard rings.

If consecutive rings are placed too far apart from each other, the depletion region may not extend from one ring to the next and the breakdown voltage may be the same as without multiple floating guard rings. Meanwhile, if the guard rings are placed too close to each other, electric field lines may still experience crowding thus resulting in a low or premature breakdown voltage. Thus, according to one embodiment of the present invention, a multiple floating guard ring design comprises a plurality of guard rings where ring spacings increase with distance from main junction 1506 while maintaining depletion region overlap, thereby alleviating electric field crowding, optimally spreading the electric field, and bringing the value of breakdown voltage close to that of the intrinsic material limit.

Figure 16:
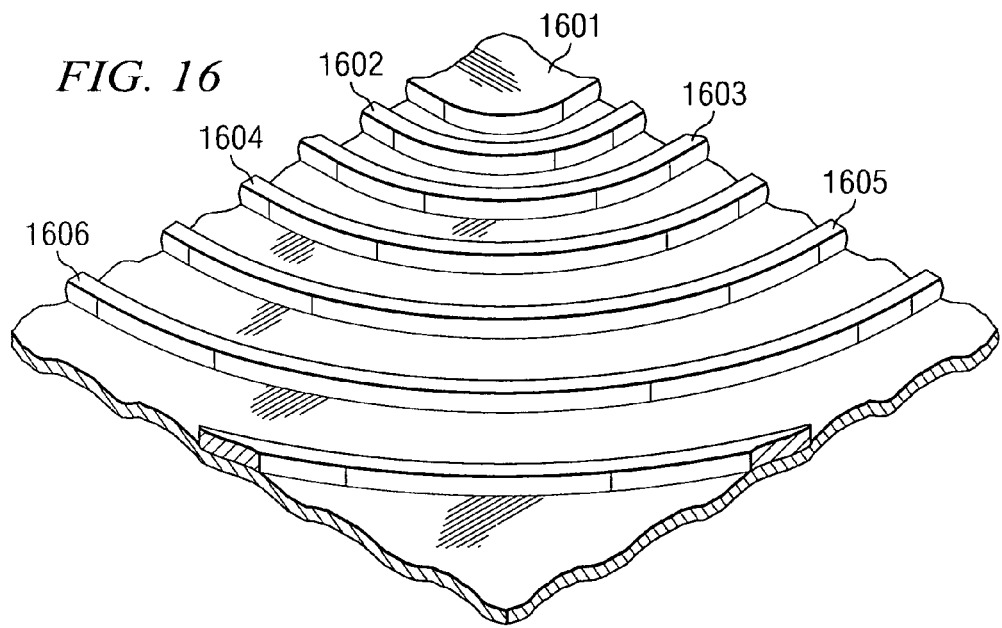
FIG. 16 is a microscopic image of a semiconductor device with multiple floating guard rings.

FIG. 16 shows a microscopic image of a semiconductor device having a plurality of floating guard rings according to an embodiment of the present invention. In one embodiment, the plurality of guard rings 1602-1606 are positioned such that ring spacings increase with distance from main junction 1601 while maintaining depletion region overlap. Multiple floating guard rings 1602-1606 may be designed empirically, for instance, via software or computer simulation. For example, for a silicon carbide implanted VJFET with a drift layer thickness of approximately 12 µm and an n doping level of about $4 \times 10^{15}$ cm², an optimal multiple floating guard ring structure according to the present invention comprises 15 rings grouped into five sets of three rings each, where each ring has a width of about 2 µm. The optimal spacing between the main junction and the first ring is about 1.5 to 2 µm. The spacings between the first and second, and second and third rings (i.e., the first set of floating guard rings) are about 2.0 µm, between the third and fourth, fourth and fifth, and fifth and sixth rings (i.e., the second set of floating guard rings) are about 2.5 µm, between the sixth and seventh, seventh and eighth, and eight and ninth rings (i.e., the third set of floating guard rings) are about 3.0 µm, between the ninth and tenth, tenth and eleventh, and eleventh and twelfth rings (i.e., the fourth set of floating guard rings) are about 3.5 µm, and 4 µm thereafter (i.e., the fifth set of floating guard rings), thus resulting in a ring structure that extends to approximately 70 µm from the main junction.

Figure 17:
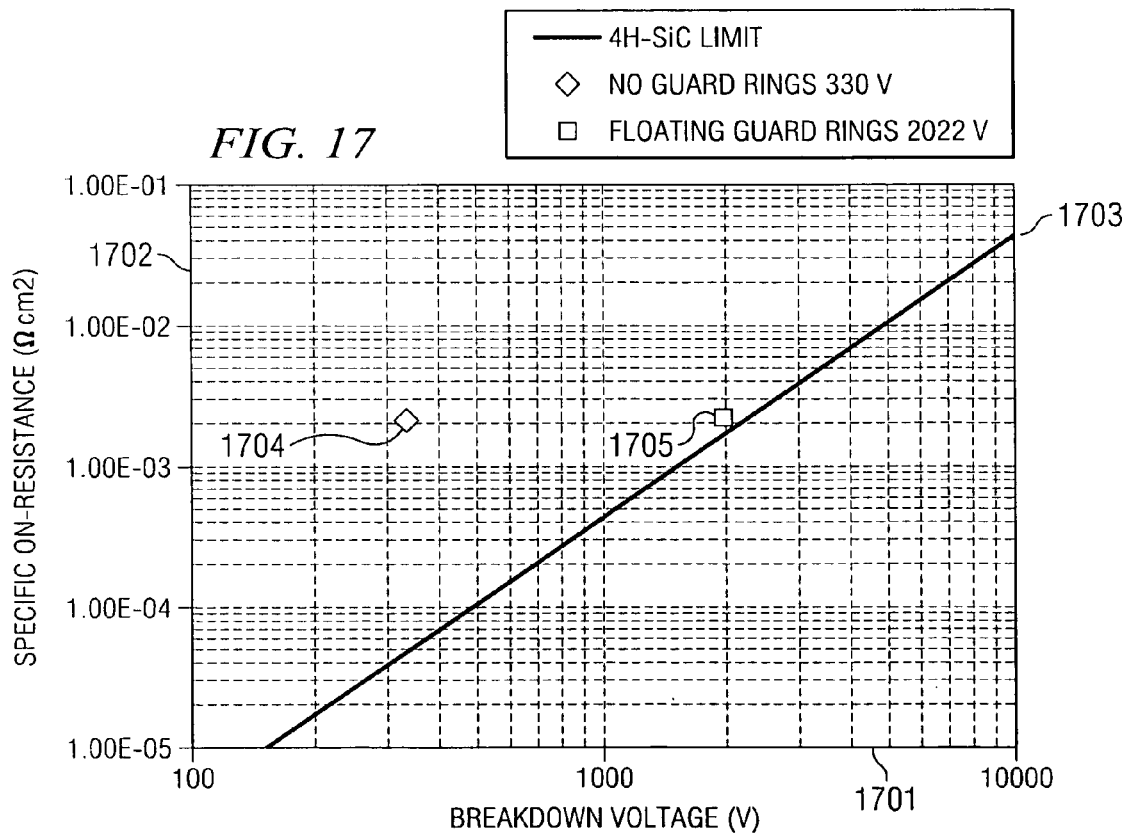
FIG. 17 is a graph of specific on-resistance versus breakdown voltage for an exemplary silicon carbide (SiC) material system.

FIG. 17 shows a graph of specific on-resistance 1702 versus breakdown voltage 1701 for an exemplary silicon carbide (SiC) material system. Line 1703 indicates the maximum SiC semiconductor device breakdown voltage, which is a function of the characteristics of the epitaxial layers of the device. Point 1704 shows a breakdown voltage of 330 V for a prior art device with a drift layer thickness of 11.79 µm and a doping level of $4 \times 10^{15}$ cm² without any guard rings. Point 1705 shows a breakdown voltage of 2022 V for a semiconductor device with the same drift layer characteristics but with the multiple floating guard ring design disclosed herein.

Figure 18:
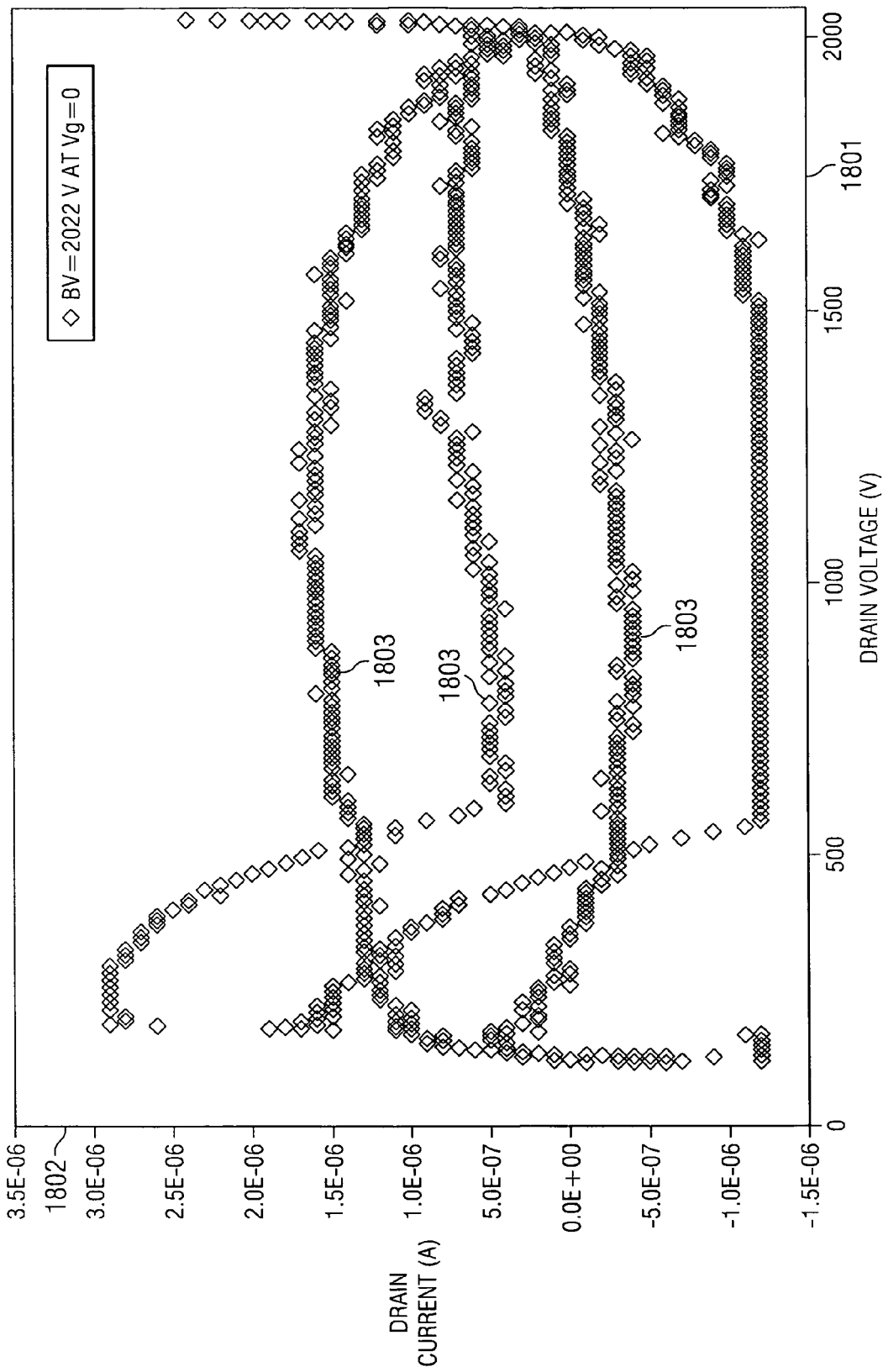
FIG. 18 is a graph of drain voltage versus drain current for a semiconductor device with multiple floating guard rings.

FIG. 18 shows a graph of drain current 1802 versus drain voltage 1801 for the exemplary semiconductor device with multiple floating guard rings described above. Data points 1803 indicate measured values of drain current as a function of drain voltage at a gate-to-source bias of zero volts. The graph shows breakdown occurring when the drain voltage reaches 2022 V, or 93% of the maximum possible value (2174 V), as determined by the intrinsic characteristics of the substrate and epitaxial layers.

Fabrication of floating guard rings typically requires a combination of lithographic steps, dielectric depositions, etchings, lift-offs, and subsequent removal of photoresist and/or dielectrics. Further, a separate impurity doping implantation step in the floating guard ring area may also be needed. In one embodiment, fabrication of the semiconductor source pillar may be followed by fabrication of the multiple floating guard ring structure. In another embodiment, depicted below with respect to FIGS. 19 and 20, multiple self-aligned floating guard rings may be fabricated simultaneously with the fabrication of the semiconductor device source pillar. This particular embodiment simplifies processing, improves breakdown yield, and allows precise control of ring proximity to the main junction along with specific widths and spacings that maximize breakdown performance.

Figure 19:
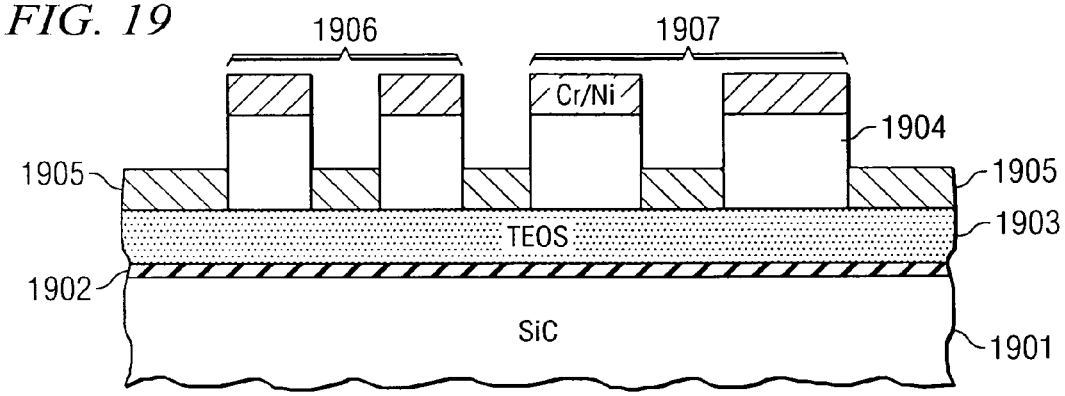
FIG. 19 is a cross-sectional view illustrating a semiconductor device with source pillars and multiple floating guard rings after evaporation of a metal mask.

FIG. 19 shows a cross-sectional view illustrating a semiconductor device (prior to multiple floating guard ring formation) after deposition of a metal layer, according to an exemplary embodiment of the present invention. First dielectric layer 1902 is deposited over substrate and epitaxial layers 1901, and second dielectric layer 1903 is deposited over first dielectric layer 1902. Photoresist 1904 is patterned over second dielectric layer 1903, and metal layer 1905 is deposited over the semiconductor device. In one embodiment, second dielectric layer 1903 may be Tetraethyl Orthosilicate (TEOS), and the metal layer may be a composition of chromium and nickel (Cr/Ni). Self-aligned floating guard rings in area 1907 will be fabricated simultaneously with self-aligned source pillars in area 1906.

Figure 20:
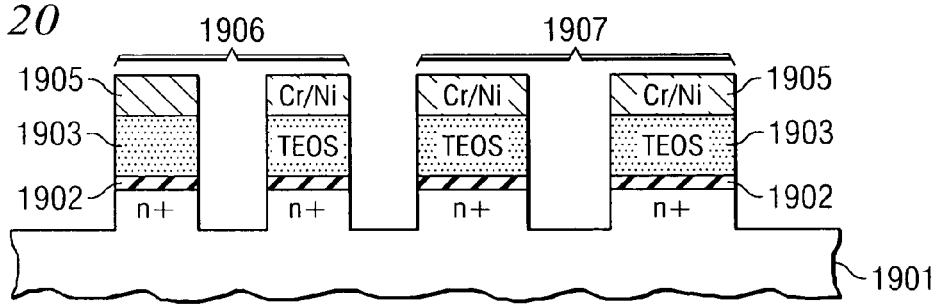
FIG. 20 is a cross-sectional view illustrating a semiconductor device with source pillars and multiple floating guard rings after metal lift-off.

FIG. 20 is a cross-sectional view illustrating the semiconductor device of FIG. 19 after metal lift-off has created a metal mask in areas 1906 and 1907, and etching has exposed the semiconductor material in the unmasked areas of the device. The etched areas will undergo an impurity doping implantation, which will create a multiple floating guard ring structure in area 1907 and a gate area between the source pillars in area 1906. This method allows a manufacturer to precisely control the position of the first floating guard ring with respect to the main junction edge, as well as the floating guard ring widths and spacings. It also eliminates the possibility of voltage breakdown performance deterioration due to broken rings, which was a common occurrence in the prior art resist/dielectric multiple floating guard ring formation methods. Moreover, processing steps are eliminated by fabricating self-aligned floating guard rings using this method.

The gate-to-source breakdown voltage of VJFETs and other devices may also be determined by the doping levels of the n channel, p+ gate, and n+ source regions, as well as by the physical separation between the gate region and source pillar. However, physical separation between gate regions also determines the value of pinch-off voltage. In many applications, including those in high voltage power electronics, it is crucial to have independent control of the pinch-off and gate-to-source breakdown voltage values. In traditional designs, a compromise is usually reached in desired pinch-off and gate-to-source breakdown voltages by adjusting the physical separation between the gate regions and source pillars. In one embodiment, depicted below with respect to FIGS. 21 and 22, a method that allows control or tailoring of the gate-to-source breakdown voltage independently of the pinch-off voltage by adjustment of the vertical separation between the n+ (source) and p+ (gate) doped regions is disclosed. This adjustment does not affect the physical separation between neighboring p+ regions, so the pinch-off voltage value remains unchanged and may be independently set.

Figure 21:
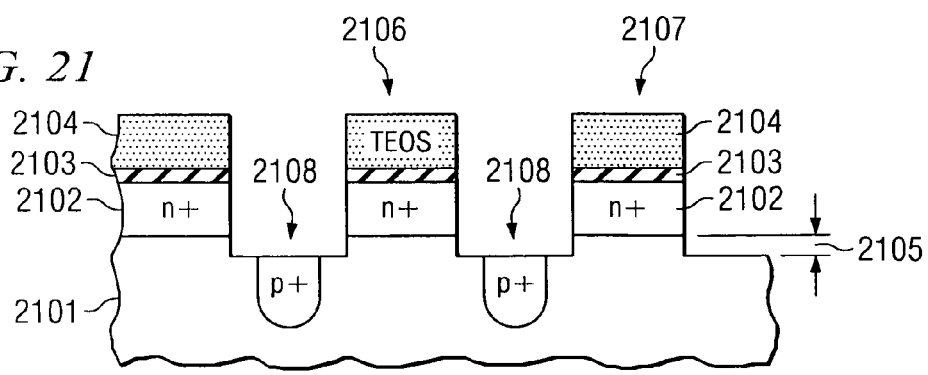
FIG. 21 is a cross-sectional view illustrating a semiconductor device over-etched to safeguard against wafer epitaxial non-uniformities.

FIG. 21 shows a cross-sectional view illustrating a semiconductor device with the n+ source layer over-etched to safeguard against non-uniformities according to an exemplary embodiment of the present invention. Dielectric layer 2104 is deposited over first dielectric layer 2103. First dielectric layer 2103 is thermally grown over the n+ source epitaxial layer 2102, which is situated on top of the n channel layer 2101. For instance, nominal 0.35 µm n+ source layer 2102 may be etched to form source pillars 2106 and 2107, followed by a 0.15 µm over-etch 2105 that safeguards against thickness non-uniformities in n+ doped source epitaxial layer 2102. Subsequently, p+ gate regions 2108 may be implanted into the n-doped channel 2101 between pillars 2106 and 2107. Gate-to-source breakdown voltage increases as the physical horizontal separation between the p+ region 2108 and the n+ region 2102 increases. Pinch-oil voltage increases as the physical horizontal separation between consecutive p+ layers 2108 increases. In many device applications it is desirable to increase the gate-to-source breakdown voltage without an accompanying increase in pinch-off voltage, as is the case with traditional designs.

Figure 22:
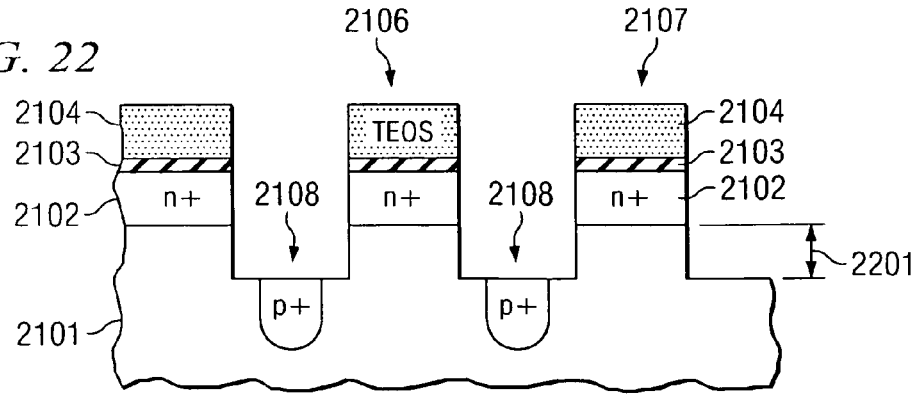
FIG. 22 is a cross-sectional view illustrating a semiconductor device with adjusted vertical separation between doped regions.

FIG. 22 is a cross-sectional view illustrating a semiconductor device with adjusted vertical separation between the p+ doped regions 2108 and the n+ doped regions 2102 according to an exemplary embodiment of the present invention. This embodiment offers an additional degree of design freedom insofar as the vertical p+ gate to n+ source separation 2105 adjusts gate-to-source breakdown-voltage, while the pinch-off voltage remains unaffected. The deeper source pillar etch has the additional benefit of lowering leakage-current. The increased vertical distance 2201 has a negligible effect on device on-state resistance, as this is dominated by the contributions of the channel and drift regions.

In one embodiment, p+ gate to n+ source separation 2201 may be designed empirically, for instance, via software or computer simulation. For example, the disclosed method has been implemented on a wafer that includes SIT devices with a 0.5 µm source-pillar etch for n+ removal, and with a 0.85 µm source pillar etch for higher breakdown-voltage performance. Table I depicted below shows an average breakdown voltage increase of approximately 55 V when using the larger (i.e., 0.85 µm) vertical separation 2201. The pinch-off voltage of the semiconductor device remains unchanged, regardless of the vertical separation value 2201 between the p+ gate and the n+ source.

TABLE I

| Die position | Breakdown Voltage (V) | |
| --- | --- | --- |
| | 0.85 µm separation | 0.5 µm separation |
| 20, 14 | 100 | 36 |
| 20, 20 | 100 | 38 |
| 20, 26 | 80 | 20 |
| 16, 23 | 105 | 28 |
| 28, 23 | 60 | 40 |
| Random die | 85 | 36 |

Although certain embodiments of the present invention and their advantages have been described herein in detail, it should be understood that various changes, substitutions and alterations can be made without departing from the spirit and scope of the invention as defined by the appended claims. Moreover, the scope of the present invention is not intended to be limited to the particular embodiments of the process, machine, manufacture, means, methods, and steps described herein. As a person of ordinary skill in the art will readily appreciate from this disclosure, other processes, machines, manufacture, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, means, methods, or steps.

We claim:
1. A semiconductor device comprising:
a source pillar having a main junction; and
a first set of floating guard rings, where:
each floating guard ring of the first set is separated from the next by a first spacing;
a first floating guard ring of the first set maintains a depletion region overlap with respect to the main junction; and
each subsequent floating guard ring of the first set spreads an electric field crowding at an edge of a previous floating guard ring.
2. The semiconductor device of claim 1, where the first set of floating guard rings comprises three floating guard rings.
3. The semiconductor device of claim 1, further comprising a second set of floating guard rings, where:
each floating guard ring of the second set is separated from the next by a second spacing;
a first floating guard ring of the second set maintains a depletion region overlap with respect to a last floating guard ring of the first set; and
each subsequent floating guard ring of the second set spreads an electric field crowding at an edge of a previous floating guard ring.
4. The semiconductor device of claim 3, where the second spacing is greater than the first spacing.
5. The semiconductor device of claim 3, where the second set of floating guard rings comprises three floating guard rings.
6. The semiconductor device of claim 3, further comprising a third set of floating guard rings, where:
each floating guard ring of the third set is separated from the next by a third spacing;
a first floating guard ring of the third set maintains a depletion region overlap with respect to a last floating guard ring of the second set; and
each subsequent floating guard ring of the third set spreads an electric field crowding at an edge of a previous floating guard ring.
7. The method of claim 1, where the semiconductor device is a semiconductor diode.
8. The method of claim 1, where the semiconductor device is a vertical semiconductor device that blocks voltage.

* * * * *

UNITED STATES PATENT AND TRADEMARK OFFICE
CERTIFICATE OF CORRECTION

PATENT NO. : 7,667,242 B1 Page 1 of 1
APPLICATION NO. : 11/601064
DATED : February 23, 2010
INVENTOR(S) : John V. Veliadis et al.

It is certified that error appears in the above-identified patent and that said Letters Patent is hereby corrected as shown below:

In the specification:

Column 7, Line 16, delete the portion of text reading "approximately 70" and replace with --approximately 75--.

Column 8, Line 52, delete the portion of text reading "Pinch-oil voltage" and replace with --Pinch-off voltage--.

Signed and Sealed this

Twenty-seventh Day of April, 2010

David J. Kappos
*Director of the United States Patent and Trademark Office*

UNITED STATES PATENT AND TRADEMARK OFFICE
CERTIFICATE OF CORRECTION

PATENT NO. : 7,667,242 B1 Page 1 of 1
APPLICATION NO. : 11/601064
DATED : February 23, 2010
INVENTOR(S) : Veliadis et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 608 days.

Signed and Sealed this

Seventh Day of December, 2010

David J. Kappos
*Director of the United States Patent and Trademark Office*